United States Patent [19]
Hellberg

[11] Patent Number: 6,167,102
[45] Date of Patent: Dec. 26, 2000

[54] SYSTEM AND METHOD EMPLOYING A REDUCED NCO LOOKUP TABLE

[75] Inventor: Richard Hellberg, Huddinge, Sweden

[73] Assignee: Telefonaktiebolaget LM Ericsson (publ), Stockholm, Sweden

[21] Appl. No.: 09/128,062

[22] Filed: Aug. 3, 1998

[51] Int. Cl.[7] .................................................. H03B 21/00
[52] U.S. Cl. ......................... 375/376; 708/271; 327/106; 327/107; 455/260
[58] Field of Search ................... 375/376; 327/105–107; 455/260; 708/271

[56] References Cited

U.S. PATENT DOCUMENTS

| | | | |
|---|---|---|---|
| 5,053,983 | 10/1991 | Hyatt | 364/724.03 |
| 5,153,526 | 10/1992 | Hori et al. | 328/14 |
| 5,270,953 | 12/1993 | White | 364/724.18 |
| 5,619,535 | 4/1997 | Alvarez, Jr. | 375/308 |
| 5,673,212 | 9/1997 | Hansen | 364/718 |
| 5,781,459 | 7/1998 | Bienz | 364/718.02 |

FOREIGN PATENT DOCUMENTS

WO 95/06990   3/1995   WIPO .

OTHER PUBLICATIONS

Campanella and Sayegh, "A Flexible On–Board Demultiplexer/Demodulator", Comsat Laboratories, Clarksburg, MD, Contract NAS3,24885.

*Primary Examiner*—Amanda T. Le
*Attorney, Agent, or Firm*—Jenkens & Gilchrist, P.C.

[57] ABSTRACT

A system and method for reducing the computational complexity of the calculations performed by a Numerically Controlled Oscillator (NCO). Through exploitation of mathematical symmetries and other techniques, the size of a lookup table of sinusoidal values employed by the NCO to approximate sinusoids may be reduced by the combination of different frequency shifts.

28 Claims, 3 Drawing Sheets

SYSTEM AND METHOD EMPLOYING A REDUCED NCO LOOKUP TABLE

BACKGROUND OF THE PRESENT INVENTION

1. Field of the Invention

The present invention is directed to an improved system and system for the modulation of a signal, particularly, to a system and method for fine-tuning a signal using a numerically controlled oscillator, more particularly, in conjunction with a convolution algorithm.

2. Background and Objects of the Present Invention

The evolution of wireless communication over the past century, since Guglielmo Marconi's 1897 demonstration of radio's ability to provide continuous contact with ships sailing the English Channel, has been remarkable. Since Marconi's discovery, new wireline and wireless communication methods, services and standards have been adopted by people throughout the world. This evolution has been accelerating, particularly over the last ten years, during which the mobile radio communications industry has grown by orders of magnitude, fueled by numerous technological advances that have made portable radio equipment smaller, cheaper and more reliable. The exponential growth of mobile telephony will continue to rise in the coming decades as well, as this wireless network interacts with and eventually overtakes the existing wireline networks.

In conjunction with the aforementioned telephonic revolutions have come advances in the processing of signals used in modern telephonic equipment. For example, convolutional encoding is utilized to better preserve the integrity of a digital transmission by convoluting or spreading the signal out, enabling error correction to reconstruct a noisy signal. Additionally, convolution algorithms, such as the fast convolution algorithm, are very effective ways of implementing digital filters, and which, when modified to employ decimation and frequency shifting, can be used in cellular base stations and other radio systems.

As is understood in the art, however, the frequency shifts possible in fast convolution algorithms are restricted to integer multiples of the spacing between the energy bins in a Discrete Fourier Transform or DFT (and inverse DFT or IDFT). Since the bin spacing in the DFT/IDFT is determined by filtering requirements, the frequency shifts can be in the order of ten kilohertz, while a frequency resolution is required that allows tuning the received channel to within 100 Hz from zero Hz (100 Hz is chosen somewhat arbitrarily, but it is nonetheless in the same order as the Doppler shift and other effects in the radio). Consequently, a Numerically Controlled Oscillator (NCO) is typically necessary for fine-tuning the signal coming from a fast convolution algorithm.

An NCO performs multiplications between a signal and a complex sinusoid to accomplish the task of converting the incoming signal, which is at a first frequency, to a second frequency. A sampling of sinusoid values is stored within a lookup table stored in a memory, e.g., a conventional Random Access Memory (RAM) or a Read Only memory (ROM). Shown in FIG. 1 is a general implementation of an NCO, where an input data stream constituting Real (Re) and Imaginary (Im) components feeds into an NCO 100, which consults a lookup table 110 connected to a phase register 120 and a phase incrementer 130, described in more detail hereinafter.

As is understood in the art, the precision requirements of the complex sinusoid values are governed by the data representation. Since a sinusoid, such as a sine wave, is only approximated, both the number of different sinusoidal phases stored and the number of bits utilized in the representation of each phase are approximations with an error component associated therewith. Also, since the errors generated in each process (phase and bit number) are independent, the errors propagate independently to create an overall error for each approximation. Errors are also introduced during each multiplication. The particular number of bits utilized for each sinusoidal representation is typically determined by the quantization noise of the sinusoid, which decreases by 6 dB for each extra bit stored per real and imaginary component of the sinusoidal phase. For example, if 90 dB of spurious-free dynamic range (SFDR) is required, 15 bits per real (in-phase, I) and imaginary (quadrature-phase, Q) value are required absent other errors.

With the above in mind, there are at present two techniques for determining optimal NCO lookup table 110 size. The first technique is to store a sufficient number of discrete sinusoidal values so that picking one of the stored values is always a "good enough" approximation of the desired sinusoid value, i.e., all frequencies can be obtained with the noise power or overall error below a given threshold. A vector representation of a selection made pursuant to this first technique is shown in FIG. 2, illustrating a full circle 200 of circumference $2\pi M$ where M is the radial vector. Eight discrete, equally spaced apart phase values are shown in FIG. 2. Consequently, any sinusoidal value extracted from lookup table 110 falls at one of these values only, e.g., vector 210, which serves as an approximation of a desired vector 220 situated between the stored values. The error in this approximation is illustrated in FIG. 2 as vector 230, which is at most $\pi/N$ where N is the number of stored phase values ($\pi/8$ for 8 phases). As is understood in the art, the frequency resolution with this strategy is defined solely by the number of bits (p) in the phase register 120 of FIG. 1, which are truncated to t when addressing the lookup table 110. The number of phases N that have to be stored to get the error to a given level is, therefore, $N=2^{(SNR+5.17)/6.02}$.

The second technique for determining the NCO lookup table 110 size is to use only those frequencies that can be exactly represented by the finite number of phases stored in the lookup table 110. Consequently, the only error in the output signal will be from the quantization of the sinusoidal values, i.e., the error made in storing the values. As is understood in the art, the frequency resolution is now $F_s/N$, where $F_s$ is the sampling frequency and N is the number of phases. In this technique, the number of different frequencies matches the number of obtainable phases N.

Since the number of values stored in the second technique decreases with decreasing sampling frequency for a given frequency resolution and the number of values stored in the first technique increases with an increased spurious-free dynamic range, it should be understood that for each dynamic range requirement there is a different breakpoint in frequency resolution for choosing between the different techniques.

It should be understood, however, that through exploitation of the symmetric properties of the unit circle, the size of the lookup table 110 may be reduced. For example, in either technique the lookup table 110 size can be reduced by a factor of eight if the number of phases, N, is divisible by four. The number of stored complex sinusoid values then decreases to N/8 even though the obtainable number of phases is still N. Since this reduction mechanism, applicable to both techniques, offers great storage savings, the number of phases commonly chosen are divisible by four. By way of example, if the dynamic range requirement is 72 dB, about $2^{13}$ "raw" values are stored per technique one, reducing to $2^{10}$ or 1,024 complex words if symmetric reductions are employed. For technique two, 100 Hz resolution at 1 MHZ sampling frequency results in N=10,000 complex words, which reduces to 1,250 due to symmetry. To illustrate the effect of increased dynamic range requirements, if 90 dB of SFDR is required, the lookup table 110 size for technique one is $2^{16}$ or $2^{13}$ (8,192) reduced, but still 1,250 (reduced) under technique two.

It should be understood that although a frequency shift in the fast convolution algorithm is virtually free, the frequency resolution for this shift operation is rather coarse. Consequently, for a given frequency resolution either the DFT/IDFT resolution must be increased to the desired level or an NCO utilized to complete the channel fine-tuning. Increasing the DFT/IDFT resolution to the desired level, however, means that unnecessarily large DFTs/IDFTs are used. The alternative requires a big lookup table in the NCO, which translates to increased chip area and power consumption when implemented as an on-chip memory. Furthermore, the power requirements for addressing and reading from a large memory is also high. Also, even when using the second technique described above, the number of stored complex values can be considerable, further increasing the area and power requirements, e.g., a resolution of a 10,000th of the sampling frequency and 90 dB of dynamic range requires the storage of 1,250 complex values each having 15 bits of representation, which translates to 37,500 bits of memory.

It is, accordingly, an object of the present invention to provide a system and method that significantly reduces the number of complex sinusoid values that are stored in the lookup table for the NCO, particularly when used in connection with a fast convolution algorithm.

It is also an object of the present invention that, by reducing the lookup table size, the apparatus utilized in the system and method employs reduced chip area, reduces the power consumption for reading the lookup table values, and, by virtue of using smaller tables and smaller buses, reduces power consumption further by eliminating large buses.

It is a further object of the present invention to reduce the computational complexity of the NCO, particularly where a small increase of the basic resolution of the fast convolution system is necessary.

SUMMARY OF THE INVENTION

The present invention is directed to an improved system and method for reducing the computational complexity of the calculations performed by a Numerically Controlled Oscillator (NCO). Through exploitation of mathematical symmetries and other techniques, the size of a lookup table of sinusoidal values employed by the NCO to approximate sinusoids may be reduced by the combination of different frequency shifts.

A more complete appreciation of the present invention and the scope thereof can be obtained from the accompanying drawings which are briefly summarized below, the following detailed description of the presently-preferred embodiments of the invention, and the appended claims.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION OF THE PRESENTLY PREFERRED EXEMPLARY EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In view of the advantages and disadvantages of using each of the aforedescribed techniques, Applicant has discovered an improved technique, which synergistically combines the advantages of the first and second techniques with that of the fast convolution algorithm and overcomes many of the disadvantages. The synergy produced in this combination will be made clear by describing the mathematical analyses entailed. In short, the system and method of the present invention combines two distinct, coarse, frequency shifted approximations to achieve a finely-tuned frequency resolution. By dividing the desired number of frequencies in the second technique by the number of points in the smaller DFT/IDFT, i.e., $N_{DFT}$, a new number is obtained by this ratio. This or a slightly larger number, both referred to herein as $N_{NCO}$, of frequencies is then chosen for the NCO 100 in FIG. 1. If $N_{NCO}$ does not have any factors in common, i.e., integer divisors, with the DFT/IDFT signal length, then the synergistic combining is possible, i.e., combining a cyclic shift of the components into the IDFT (or out of the DFT) with a frequency shift by one of the frequencies in the now reduced set of frequencies within the NCO 100. Through this combination of a coarse frequency shift in the frequency (discrete Fourier) domain with a different, coarse frequency shift in the NCO, a fine frequency resolution is obtained.

Figure 3:
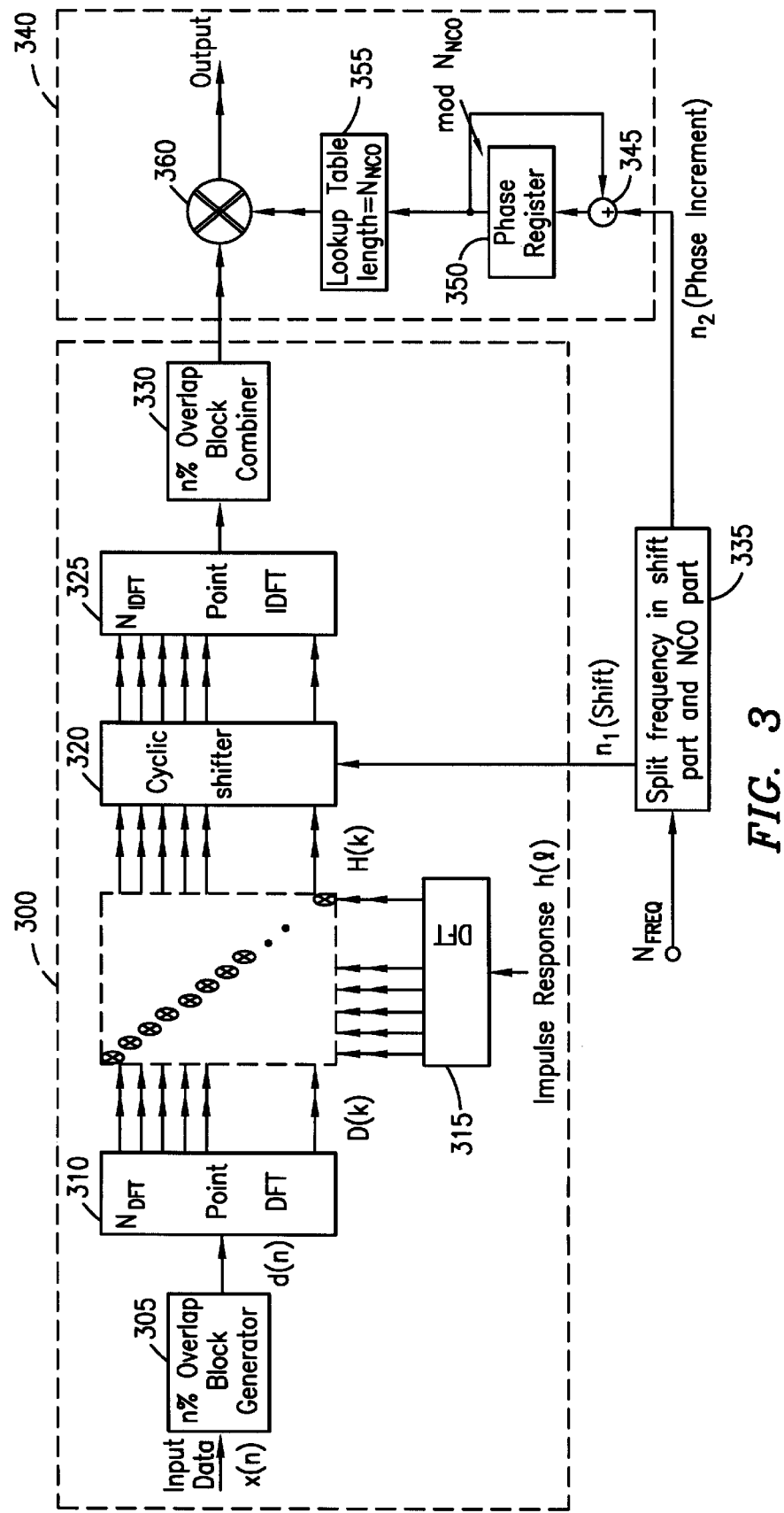
FIG. 3 illustrates a system configuration employing the present invention.

An implementation of the improved system and method of the present invention, employing this synergistic combination, is shown in FIG. 3. It should be understood that an advantage of the present invention is ease of incorporation into existing circuitry. For example, in FIG. 3 the reference numeral 300 generally designates portions of the aforementioned standard or modified fast convolution algorithm. As is understood in the art, the fast convolution algorithm employs a block generator 305 which generates overlapping blocks of signal data, d(n), from the input data, x(n). The respective blocks d(n) are then Fourier transformed with a conventional Discrete Fourier Transformer (DFT) 310, forming data blocks D(k), which are multiplied with another DFT 315 that receives impulse response data, h(l). A cyclic shifter 320 cyclically shifts the multiplied results by a shift amount $n_1$. The shifted values are then inverse transformed in an Inverse DFT 325 and block assembled in a block combiner 330. It should be understood that the methods of block generation and combining are generally referred to as "overlap-add" and "overlap-save". It should also be understood that the aforedescribed elements (except for cyclic shifter 320) are part of the standard or modified fast convolution algorithm, designated by the reference numeral 300.

Figure 1:
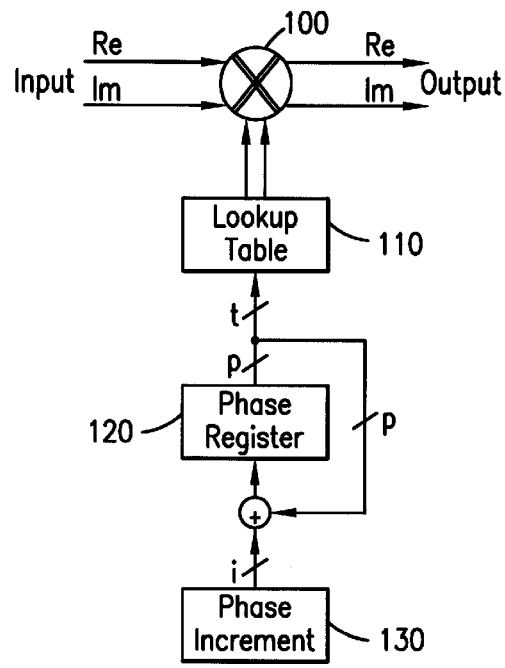
FIG. 1 is an illustration of the general operation of a Numerically Controlled Oscillator (NCO) such as employed in practicing the system and method of the present invention.
Figure 2:
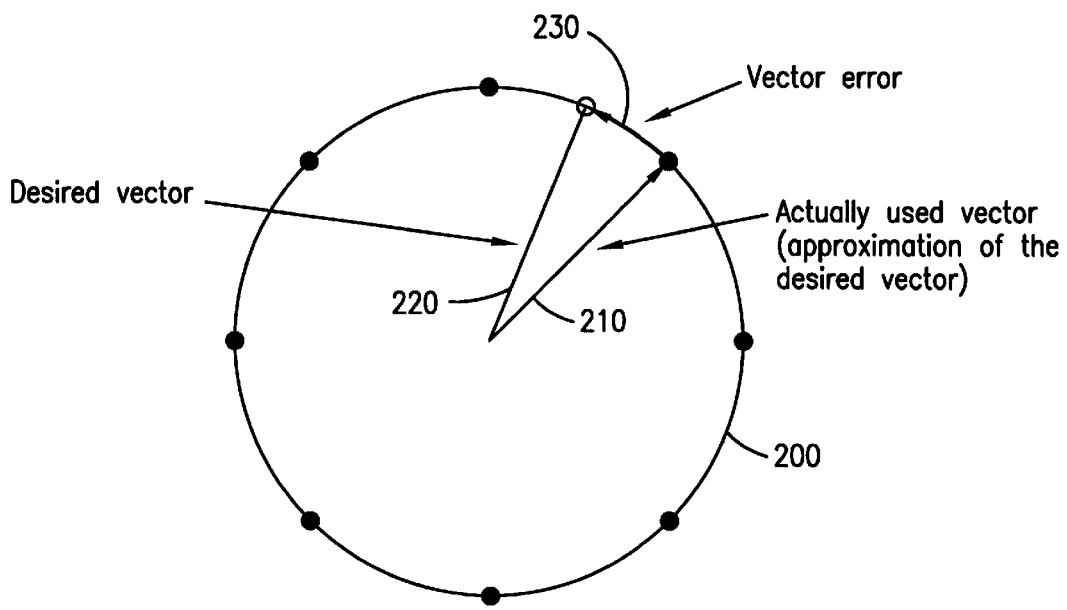
FIG. 2 is a vector illustration of the errors present in approximating a sinusoidal value.

The cyclic shifter 320 cyclically shifts the inputs to the IDFT 325 by $n_1$, providing a coarse frequency shift to the signal being treated. With further reference to FIG. 3, there is illustrated a splitter 335 which "splits" a particular frequency, $N_{FREQ}$, into the shift amount $n_1$ and a phase increment $n_2$ corresponding to that particular frequency $N_{FREQ}$. A numerically controlled oscillator (NCO) 340 receives the phase increment $n_2$ at an adder 345 and a phase register 350. As shown in the figure, the output of the phase register 350 is added to the phase increment $n_2$ at adder 345 on each clock cycle, as also illustrated in FIG. 1. The phase register 350 then addresses a lookup table 355 having a length $N_{NCO}$, which outputs a sinusoid phase to be multiplied at a combiner or adder 360 with the signal from the fast convolution algorithm 300, also providing a coarse frequency shift to the signal.

The mathematics employed in implementing the improved system and method of the present invention will now be described. The total number of frequencies available in the system is N which is the product of the number of points in the DFT/IDFT by the number of frequencies chosen for the NCOs 100 and 340, that is:

$$N = N_{DFT} \cdot N_{NCO} \tag{1}$$

A condition placed on the $N_{DFT}$ (which also denotes the length of the IDFT) and the $N_{NCO}$ in the present invention is that they are coprime, i.e., they fail to share any common factors between them. For example, the numbers 8 and 15 are coprime since they share no common factor. If the $N_{DFT}$ and $N_{NCO}$ were to so share a common factor, e.g., K, then:

$$N_{defective} = \frac{N_{DFT} \cdot N_{NCO}}{K} \tag{2}$$

In this situation, the original $N_{NCO}$ can clearly be decimated to $N_{NCO}/K$ without a loss in resolution. Conversely, if the resolution increase is required to be by a factor R (a factor in the DFT/IDFT) to the power x, then $N_{NCO}$ must increase by this factor but to the next higher power, i.e., $R^{X+1}$. It should be apparent, however, that this is not a good idea since with many common Fast Fourier Transform (FFT) sizes this would forfeit the purpose of the reduction.

Since a particular frequency value, e.g., $N_{FREQ}$, is a combination of shift and NCO frequency, the formula for obtaining the number of the particular frequency is:

$$N_{FREQ} = n_1 N_{NCO} + n_2 N_{DFT} (\text{mod } N) \tag{3}$$

By taking the modulo N of the sum in (3), this takes care of situations in the complex frequency domain where frequencies higher than $F_s$ wrap around. The frequency f corresponding to $N_{FREQ}$ is therefore:

$$f = \frac{F_s \cdot N_{FREQ}}{N} \tag{4}$$

With reference again to FIG. 3, the frequency splitter 335 solves the inverse equation necessary to finding $N_{FREQ}$ from $n_1$ and $n_2$, i.e., finding the particular values for $n_1$ and $n_2$ that result in the desired frequency number $N_{FREQ}$. The formulas for this operation can also be written as simple and direct modulo multiplications:

$$n_1 = N_{FREQ} \cdot k_1 (\text{mod } N_{DFT}) \tag{5a}$$

$$n_2 = N_{FREQ} \cdot k_2 (\text{mod } N_{NCO}) \tag{5b}$$

where $k_1$ and $k_2$ are constants associated with each set of $N_{DFT}$ and $N_{NCO}$, respectively. It should be understood that $k_1$ and $k_2$ need only be computed once when designing the system and then be used together with the DFT/IDFT 310/325 and NCO 340, respectively. Although there are infinitely many suitable $k_1$ and $k_2$ values (in equations 5a and 5b), all may be formed from $k_{10}$ and $k_{20}$, respectively, through the following equations:

$$k_1 = k_{10} + x_1 N_{DFT} \tag{6a}$$

$$k_2 = k_{20} + x_2 N_{NCO} \tag{6b}$$

where $x_1$ and $x_2$ are arbitrary integers. It should be understood that since $k_1$ and $k_2$ can always be less than $N_{DFT}$ and $N_{NCO}$, respectively, it is generally sufficient to find the lowest values for $k_1$ and $k_2$, i.e., $k_{10}$ and $k_{20}$, respectively, in the above equations.

In view of the above discussion, $k_1$ and $k_2$ can be found by solving the equation:

$$k_1 N_{NCO} + k_2 N_{DFT} = 1 (\text{mod } N) \tag{7}$$

By introducing the numbers:

$$N_{NCO, DFT} = N_{NCO} (\text{mod } N_{DFT}) \tag{8a}$$

$$N_{NCO, DFT} = N_{DFT} (\text{mod } K_{NCO}) \tag{8b}$$

equation (7) can be transformed into a set of two equations:

$$k_1 N_{NCO, DFT} = 1 (\text{mod } N_{DFT}) \tag{9a}$$

$$k_2 N_{DFT, NCO} = 1 (\text{mod } N_{NCO}) \tag{9b}$$

which may be solved by the Euclidean algorithm or by simply searching through different $k_1$ within the range of zero to $N_{DFT}$ minus one and different $k_2$ within the range of zero to $N_{NCO}$ minus one. It should be understood, of course, that a short program may be utilized for finding appropriate values for $k_1$ and $k_2$ by a full search, i.e., testing the forward algorithm for up to N different values.

In like manner, the original equation (3) for finding $n_1$ and $n_2$ can also be separated into two equations:

$$n_1 N_{NCO, DFT} = N_{FREQ} (\text{mod } N_{DFT}) \tag{10a}$$

$$n_2 N_{DFT, NCO} = N_{FREQ} (\text{mod } N_{NCO}) \tag{10b}$$

which may also be solved by the Euclidean algorithm. This operation is performed for each new $N_{FREQ}$. It should be understood, however, that it is easier to use the algorithm only once for finding $k_1$ and $k_2$ and use these numbers with the simpler equations. The $k_1$ and $k_2$ are then used by the frequency splitter in FIG. 3 to compute the $n_1$ and $n_2$ values, respectively, which are routed in different directions as shown in the figure.

Figure 4:
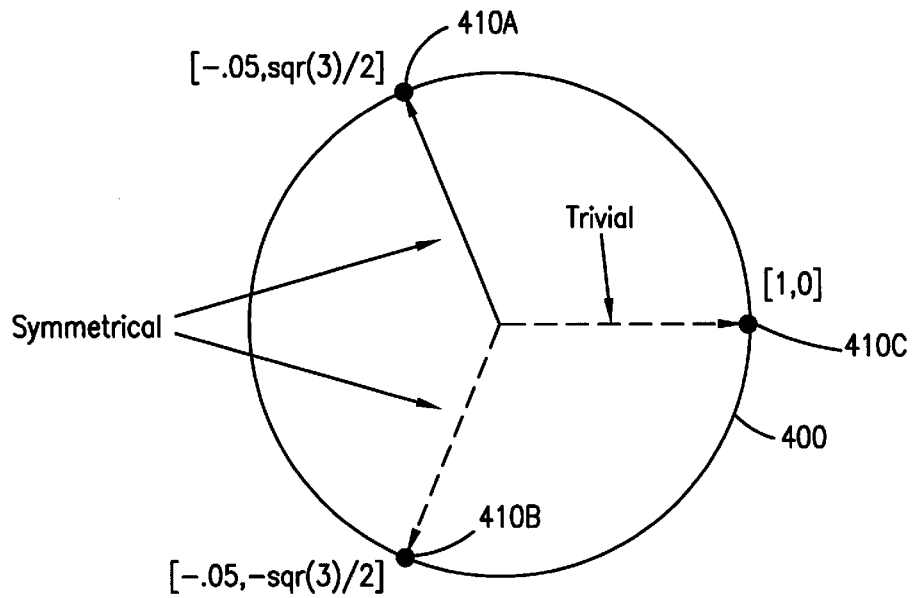
FIG. 4 is a vector illustration of complex value representations and symmetries.

Through utilization of the aforementioned mathematical operations, reductions can be made to the number of sinusoid values stored in the lookup table 110/355. For example, if the new number $N_{NCO}$ in equation (1) is divisible by four, then a reduction by a factor of about eight is possible, as described hereinbefore, through exploitation of symmetries of evenly-spaced points on a unit circle, particularly if one of those points is (1,0), a trivial value. If $N_{NCO}$ is divisible by two, a reduction by four is possible. Also, if the new number $N_{NCO}$ is odd, which is likely since the DFT lengths are often powers of two when computed by FFT algorithms, a reduction by more than two is still possible since the set of complex vectors for the different phases can be made symmetrical about the real axis by setting one of the sinusoid values to complex (1,0), which being trivial need not be stored. Shown in FIG. 4 is a reduction for an NCO 100/340 having three phases. Since values 410A and 410B along the circle 400 are symmetrical, i.e., (−0.5, sqr(3)/2) and (−0.5, −sqr(3)/2), respectively, and value 410C is trivial, only one value, i.e., value 410A, need be stored.

By way of a further example, in a system having an IDFT of length 32, sampling frequency $F_s$ of 1 MHZ and the minimum required resolution is 100 Hz, the total number of discrete frequencies needed is, therefore, 10,000 (1 MHZ/100 Hz). Using conventional reduction, the number of stored phases can be reduced eightfold to 1,250, as discussed in the background section of this patent application. Using the improved system and method of the present invention, however, a number $N_{NCO}$ is selected that is greater than or equal to 10,000/32 ($N/N_{DFT}$), which is 312.5, and odd, such as 313. This is the number of equally spaced phases of a sinusoid that must be stored within the lookup table 110 so that the 10,000 frequencies (N) can be synthesized by the combination of the cyclic shift in the frequency domain and frequency conversion in an NCO. The particular values for $k_1$ and $k_2$ for this system are 9 and 225. By omitting the trivial (1,0) value, the number of stored complex sinusoid values can be reduced to half, i.e., 156, due to the symmetry of values about the real axis in the complex number domain, as described and illustrated in connection with FIG. 4.

Figure 5:
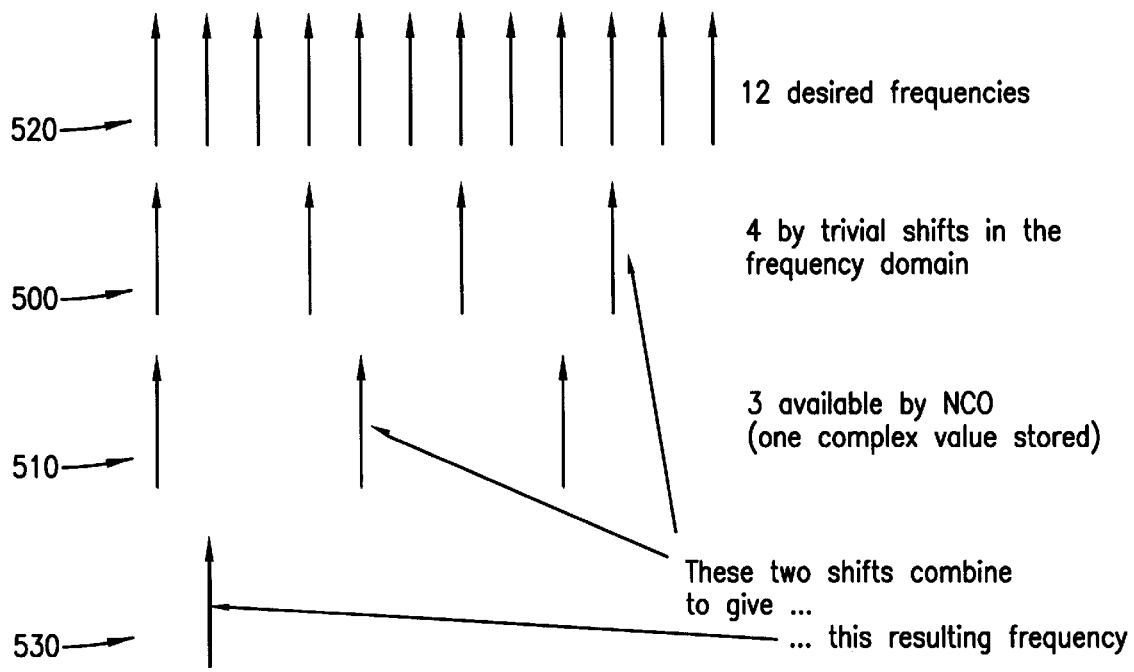
FIG. 5 is a diagram illustrating the combination of two frequency shift values to determine a given desired frequency in accordance with the present invention.

Accordingly, the number of stored sinusoid values pursuant to the system and method of the present invention can be reduced by a further eightfold over the conventional approach, i.e., 1/64th of N. With reference now to FIG. 5, there is illustrated a simple system with a four-point IDFT, i.e., four equally spaced trivial shifts in the frequency domain (generally referred to herein by the reference numeral 500) and a resolution increase by three in the NCO (generally referred to herein by the reference numeral 510) further demonstrates the reduction properties of the present invention. As shown, there are 12 desired frequencies, i.e., N=12, generally referred to herein by the reference numeral 520, with the NDFT 500 being four and the NNC 510 being three (only one complex value stored). All of the twelve frequency values 520 are merely linear combinations of the coarse frequency domain 500 and NCO 510 values, including the resultant frequency 530.

By way of another example, in systems where the DFT/IDFT bin spacing is chosen as a multiple of the carrier spacing (or a multiple of an integer fraction of the carrier spacing), the number of stored phases in the lookup table 110 can be very small. For example, when increasing the resolution by a factor of five in a system with an IDFT length of 64, conventional techniques require 64×5=320 phases, which may be reduced to one eighth so that only 40 complex sinusoidal values need storing. The improved system and method of the present invention, however, requires the storage of but five phases, which in turn reduces to storing only two complex values, which constitutes a twentyfold improvement over the best conventional techniques. It should be understood, however, that the system and method of the present invention would require a partitioning of the frequency shift between the NCO and the trivial shift in the frequency domain.

As a further benefit of the improved technique of the present invention, the computational complexity of the system is also reduced, particularly if only a small increase in resolution is necessary. As is understood in the art, an NCO normally utilizes a minimum of three multipliers for performing a complex multiplication on each input sample received. In the configuration of the present invention, however, increasing the resolution by three requires multiplication with three equally spaced phases of a sinusoid, i.e., (1,0), (−0.5, sqr(3)/2), and (−0.5, sqr(3)/2), which as previously discussed translated to actual multiplication by only one of the three values. Consequently, a maximum of four multiplications per three output samples are performed, as opposed to the nine required by the conventional techniques.

It should, however, be understood that one limitation on the system and method of the present invention is that the size of the lookup table should not be a multiple of any factor in the IDFT size. Whereas in conventional systems factors of two are often employed to take advantage of the eightfold table size reduction, factors of two in the present invention are usually not the best choice since the FFT/inverse FFT lengths are frequently powers of two. This limitation, however, is not severe since for every even number there is an odd number adjacent thereto. It should also be noted that the conventional techniques are also limited, albeit to a lesser extent, since only lookup table lengths that are integer multiples of four can be used if the full reductions are to be even possible.

It should also be understood that although the preferred embodiment of the system and method of the present invention is used in conjunction with the fast convolutional algorithm and an NCO, the present invention is not so limited and is applicable to other systems employing DFT/IDFT. A basic requirement is that a regularly spaced set of frequency shifts are possible in the original system and the improvements of the present invention adds more resolution to this existing set of frequency shifts.

It should further be understood that the present invention is also applicable in systems entirely without DFTs/IDFTs. For example, a resolution by $F_s/4$ is possible without multiplications by trivially "multiplying" with a sequence $j^{kp}$, where k=0, 1, 2 or 3 selects the frequency and p is an index of the sample to be multiplied by the $j^{kp}$. The four frequencies (Np=4) of this primitive can be combined with an odd number of frequencies, $N_{NCO}$, in another NCO to obtain N=Np*$N_{NCO}$ different frequencies. Since only half of the sinusoidal values, $N_{NCO}/2$, need to be stored, this technique provides an eightfold reduction in size, which is the same number as in conventional systems. A drawback in using this alternative embodiment of the present invention, however, is that factors of two cannot be used in making up $N_{NCO}$.

It should also be understood that although the preferred embodiment of the present invention utilizes the split between two different frequency shifts, the system and method of the present invention are also applicable for combinations of three or more frequency shifts, provided that the numbers of equally-spaced frequencies available in the different stages are all coprime. The system and method of the present invention is therefore available as a general tool for lookup table size reduction.

Although preferred embodiments of the system and method of the present invention have been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A numerically controlled oscillator for combining frequencies depending upon input numerical data, said numerically controlled oscillator comprising:

a combiner for combining a first and a second set of frequencies for said input numerical data, said first set of frequencies being spaced apart by a first shift amount, and said second set frequencies being spaced apart by a second shift amount, the numbers of frequencies within said first and second sets being coprime with respect to each other; and output means for outputting an output oscillation frequency based upon the combination of frequencies within said first and second sets.

2. The numerically controlled oscillator according to claim 1, wherein said first set of frequencies are utilized by a convolution algorithm.

3. The numerically controlled oscillator according to claim 2, wherein said convolution algorithm is a fast convolution algorithm.

4. The numerically controlled oscillator according to claim 2, wherein said convolution algorithm is a modified convolution algorithm.

5. The numerically controlled oscillator according to claim 1, wherein said second set of frequencies are utilized by said numerically controlled oscillator.

6. The numerically controlled oscillator according to claim 1, wherein said first set of frequencies are generated by a discrete Fourier transform means attached to said numerally controlled oscillator and forwarded thereto.

7. The numerically controlled oscillator according to claim 1, further comprising:

at least one other set of frequencies for said input numerical data, each of said at least one other set of frequencies being spaced apart by respective shift amounts, said spacings for said first, second and said at least one other set being coprime with respect to each other, whereby each output oscillation frequency is a combination of frequencies within said first, second and said at least one other set.

8. The numerically controlled oscillator according to claim 1, further comprising:

a lookup table for storing therein said second set of frequencies, said first and second sets of frequencies being combined in an adding means to produce said output oscillation frequency.

9. The numerically controlled oscillator according to claim 8, further comprising:

a phase register for addressing a given frequency within said lookup table.

10. The numerically controlled oscillator according to claim 1, wherein said output oscillation frequency is a linear combination of said first and second sets of frequencies.

11. The numerically controlled oscillator according to claim 10, wherein said linear combination is represented by the equation:

$$N_{FREQ} = n_1 N_{NCO} + n_2 N_{DFT} (\mathrm{mod}\ N)$$

wherein $N_{FREQ}$ is said output oscillation frequency, $N_{NCO}$ is the number of frequencies in said first set, $N_{DFT}$ is the number of frequencies in said second set, N is the total number of frequencies, and $n_1$ and $n_2$ are integers.

12. The numerically controlled oscillator according to claim 11, wherein $n_1$ and $n_2$ are represented by the equations:

$$n_1 = N_{FREQ} \cdot k_1 (\mathrm{mod}\ N_{DFT}) \text{ and } n_2 N_{FREQ} \cdot k_2 (\mathrm{mod}\ N_{NCO})$$

wherein $k_1$ and $k_2$ are integers.

13. A numerically controlled oscillator system whose output oscillation frequency is controlled depending upon input numerical data, said numerically controlled oscillator system comprising:

a first frequency shifting means for shifting an input frequency within a first set of frequencies, said first set of frequencies being spaced apart by a first shift amount;

a second frequency shifting means for shifting said input frequency within a second set of frequencies, said second set of frequencies being spaced apart by a second shift amount, the numbers of frequencies within said first and second sets being coprime with respect to each other, whereby each output oscillation frequency is a combination of frequencies within said first and second sets.

14. The numerically controlled oscillator system according to claim 13, wherein said first frequency shifting means is a convolution algorithm device employing a convolution algorithm therein.

15. The numerically controlled oscillator system according to claim 14, wherein said convolution algorithm is a fast convolution algorithm.

16. The numerically controlled oscillator system according to claim 14, wherein said convolution algorithm is a modified convolution algorithm.

17. The numerically controlled oscillator system according to claim 13, wherein said second frequency shifting means is a numerically controlled oscillator.

18. The numerically controlled oscillator system according to claim 17, wherein said numerically controlled oscillator comprises:

a lookup table for storing therein said second set of frequencies, said first and second sets of frequencies being combined in an adding means to produce said output oscillation frequency.

19. The numerically controlled oscillator system according to claim 18, wherein said numerically controlled oscillator further comprises a phase register for addressing a given frequency within said lookup table.

20. The numerically controlled oscillator system according to claim 13, further comprising:

at least one other frequency shifting means for shifting said input frequency within at least one other set of frequencies, each said at least one other set of frequencies being spaced apart by a respective shift amount, the numbers of frequencies within said first, second and at least one other set of frequencies being coprime with respect to each other, whereby each output oscillation frequency is a combination of frequencies within said first, second and at least one other set of frequencies.

21. The numerically controlled oscillator system according to claim 13, wherein said output oscillation frequency is a linear combination of said first and second sets of frequencies.

22. The numerically controlled oscillator system according to claim 13, further comprising:

a splitter in communication with said first and second frequency shifting means, said splitter receiving said input frequency and forwarding said first shift amount to said first frequency shifting means, and said second shift amount to said second frequency shifting means.

23. A method for modulating an input frequency through a numerically controlled oscillator, said method comprising the steps of:

shifting said input frequency within a first set of frequencies, said first set of frequencies being spaced apart by a first shift amount;

shifting said input frequency within a second set of frequencies, said second set of frequencies being spaced apart by a second shift amount, the numbers of frequencies within said first and second sets being coprime with respect to each other; and forming, by said numerically controlled oscillator, an output oscillation frequency, said output oscillation frequency being a combination of frequencies within said first and second sets.

24. The method according to claim 23, wherein said step of shifting said input frequency within said first set of frequencies comprises application of a convolution algorithm.

25. The method according to claim 24, wherein said convolution algorithm is a fast convolution algorithm.

26. The method according to claim 24, wherein said convolution algorithm is a modified convolution algorithm.

27. The method according to claim 23, further comprising:

a lookup table for storing therein said second set of frequencies, said first and second sets of frequencies being combined in an adding means to produce said output oscillation frequency.

28. The method according to claim 23, further comprising the step of: shifting said input frequency within at least one other set of frequencies, said at least one other set of frequencies being spaced apart by a respective shift amount, wherein said output oscillation frequency is a combination of frequencies within said first, second and said at least one other set of frequencies.

* * * * *

UNITED STATES PATENT AND TRADEMARK OFFICE
CERTIFICATE OF CORRECTION

PATENT NO. : 6,167,102
DATED : December 26, 2000
INVENTOR(S) : Richard Hellberg

It is certified that error appears in the above-identified patent and that said Letters Patent is hereby corrected as shown below:

Column 7,
Line 48, replace "NDFT" with -- $N_{DFT}$ --; and -- NNC," with -- $N_{NCO}$ --

Signed and Sealed this

Nineteenth Day of March, 2002

Attest:

Attesting Officer

JAMES E. ROGAN
Director of the United States Patent and Trademark Office